(12) United States Patent
Petrov et al.

(10) Patent No.: US 7,223,974 B2
(45) Date of Patent: May 29, 2007

(54) CHARGED PARTICLE BEAM COLUMN AND METHOD FOR DIRECTING A CHARGED PARTICLE BEAM

(75) Inventors: Igor Petrov, Holon (IL); Zvika Rosenberg, Jerusalem (IL)

(73) Assignee: Applied Materials, Israel, Ltd., Rehovot (IL)

( * ) Notice: Subject to any disclaimer, the term of this patent is extended or adjusted under 35 U.S.C. 154(b) by 737 days.

(21) Appl. No.: 10/154,530

(22) Filed: May 22, 2002

(65) Prior Publication Data
US 2003/0218133 A1 Nov. 27, 2003

(51) Int. Cl.
*H01J 37/256* (2006.01)
*H01J 37/28* (2006.01)

(52) U.S. Cl. .................. 250/310; 250/307; 250/309

(58) Field of Classification Search ............. 250/492.2, 250/396 ML
See application file for complete search history.

(56) References Cited

U.S. PATENT DOCUMENTS

| | | | |
|---|---|---|---|
| 4,321,510 A | 3/1982 | Takigawa | |
| 5,329,125 A | 7/1994 | Feuerbaum | |
| 5,627,373 A | 5/1997 | Keese | |
| 5,734,164 A | 3/1998 | Sanford | |
| 5,894,124 A | 4/1999 | Iwabuchi et al. | |
| 5,900,629 A | 5/1999 | Todokoro et al. | |
| 5,952,667 A * | 9/1999 | Shimizu ................. 250/492.2 | |
| 6,037,589 A | 3/2000 | Yonezawa et al. | |
| 6,452,175 B1 * | 9/2002 | Adamec ................... 250/310 | |
| 2001/0010362 A1 | 8/2001 | Simizu | |
| 2002/0179851 A1 * | 12/2002 | Sato et al. ............... 250/491.1 | |
| 2003/0205678 A1 * | 11/2003 | Notte .................... 250/423 F | |

FOREIGN PATENT DOCUMENTS

| | | |
|---|---|---|
| EP | 1 045 426 A2 | 10/2000 |
| EP | 1 263 018 A2 | 4/2002 |
| JP | 2000156189 | 6/2000 |
| WO | WO 01/45136 A1 | 6/2001 |
| WO | WO 200145136 A1 * | 6/2001 |

OTHER PUBLICATIONS

International Search Report, PCT/US 03/14974.

* cited by examiner

*Primary Examiner*—Jack I. Berman
(74) *Attorney, Agent, or Firm*—Tarek N. Fahmi

(57) ABSTRACT

A method and charged particle beam column are presented for directing a primary charged particle beam onto a sample. The primary charged particle beam, propagating along an initial axis of beam propagation towards a focusing assembly, passes through a beam shaper, that affects the cross section of the primary charged particle beam to compensate for aberrations of focusing caused by astigmatism effect of a focusing field produced by an objective lens arrangement of the focusing assembly, and then passes through a beam axis alignment system, that aligns the axis of the primary charged particle beam with respect to the optical axis of the objective lens arrangement.

34 Claims, 3 Drawing Sheets

CHARGED PARTICLE BEAM COLUMN AND METHOD FOR DIRECTING A CHARGED PARTICLE BEAM

FIELD OF THE INVENTION

This invention relates to a charged particle beam column and method for use in the inspection of samples by irradiating them with a focused beam of electrically charged particles, such as electrons, positrons, or ions.

BACKGROUND OF THE INVENTION

Charged particle beam columns are typically employed in scanning electron microscopy (SEM), which is a known technique widely used in the manufacture of semiconductor devices, being utilized in a CD metrology tool, the so-called CD-SEM (critical dimension scanning electron microscope) and defect review SEM. In a SEM, the region of a sample to be examined is two-dimensionally scanned by means of a focused primary beam of electrically charged particles, usually electrons. Irradiation of the sample with the primary electron beam releases secondary (and/or backscattered) electrons. The secondary electrons are released at that side of the sample at which the primary electron beam is incident, and move back to be captured by a detector, which generates an output electric signal proportional to the so-detected electric current. The energy and/or the energy distribution of the secondary electrons is indicative of the nature and composition of the sample.

SEM typically includes such main constructional parts as an electron beam source (formed with a small tip called "electron gun"), an electron beam column, and a detector unit. The electron beam column includes inter alia a gun alignment system, a beam blank means, a beam axis alignment system (usually called "aperture alignment coils"), a beam shaper system (typically a "stigmator" composed of one or more quadruple lenses), and a focusing assembly (including an objective lens arrangement) and one or more deflectors. A primary electron beam propagating towards a focusing assembly undergoes beam axis alignment while passing through the alignment coils, and is then affected by a stigmator.

The alignment of the primary beam axis is typically aimed at correcting various aberrations of focusing, and consists of deflecting the primary beam axis to ensure that the beam axis passes through a specific point of the objective lens arrangement, usually called the "central" point thereof. This "specific point" is such that changing the energy of a beam that passes through this point in the objective lens arrangement will not cause the beam deflection by the objective lens arrangement. Generally speaking, the beam axis should be aligned with respect to the optical axis of the objective lens arrangement so as to ensure minimal spot-size imaging of the cathode-tip onto the sample's surface. A stigmator, in turn, typically creates a magnetic or electrostatic field affecting the cross section of the primary beam to compensate for aberrations of focusing caused by astigmatism effect of the objective lens arrangement (e.g., axial asymmetry of the focusing field of the objective lens arrangement), and to ensure a substantially circular cross section of the primary beam that has been focused onto a sample by the focusing assembly.

The detector unit may be located outside the path of the primary beam propagation through the column. In this case, a generator of orthogonal electric and magnetic fields (known as Wien-filter) is employed to direct secondary electrons to the detector (e.g., U.S. Pat. Nos. 5,894,124; 5,900,629). To ensure detection of those secondary electrons that are not sufficiently deflected by the Wien-filter, a target or extracting electrode made of a material capable of generating a secondary electron when an electron collides therewith is additionally used. Such a target is formed with an aperture and is located such that the axis of the primary beam propagation towards the focusing assembly intersects with this aperture, which thereby serves as a primary beam hole.

As disclosed in WO 01/45136 assigned to the assignee of the present application, the detector unit includes a detector having a primary beam hole that is located in the path of a primary electron beam propagating towards the focusing assembly. Here, a deflection system associated with the focusing assembly operates to affect the trajectory of the primary electron beam such that the primary electron beam impinges onto a sample along an axis forming a certain angle with the sample's surface (the so-called "tilt mode"). The tilt mode is usually utilized to inspect samples that have a surface relief, i.e., pattern in the form of a plurality of spaced-apart grooves to detect the existence of a foreign particle located inside a narrow groove.

Generally, a tilt mechanism can be implemented by mechanically tilting either the sample carrier relative to the charged particle beam column (e.g., U.S. Pat. Nos. 5,734, 164; 5,894,124; 6,037,589) or the column relative to the sample's stage (e.g., U.S. Pat. No. 5,329,125). According to the above-indicated technique of WO 01/45136, a tilt mechanism is achieved by affecting the trajectory of the primary electron beam using single- or double-deflection. The use of a double-deflection technique, namely, pre-lens and in-lens deflection stages, for stereoscopic visualization of a sample is also known, being disclosed, for example, in EP 1045426.

SUMMARY OF THE INVENTION

There is a need in the art to facilitate inspection of samples by a charged particle beam, by providing a novel charged particle beam column and method of directing a primary beam through the column.

The term "primary beam" or "primary charged particle beam" used herein signifies a charged particle beam, which is formed by charged particles generated by a source (cathode), and which is to be directed to a sample to knock out charged particles forming a "secondary beam" (also referred to as "secondary charged article beam"), which is to be detected.

In the column, the primary beam is typically directed along an initial axis of beam propagation towards a focusing assembly, which includes an objective lens arrangement that defines an optical axis. The invention provides for aligning the primary beam axis with respect to the optical axis of the objective lens arrangement after the primary beam passage through a beam shaper system (stigmator). This is associated with the following.

The alignment of the primary beam axis is typically aimed at correcting various aberrations of focusing, and consists of deflecting the primary beam from the initial axis of beam propagation to ensure that the beam axis passes through the specific point of the objective lens arrangement. The passage of the primary beam through a stigmator is aimed at compensating for aberrations of focusing caused by the astigmatism effect of the objective lens arrangement, to ensure a predefined cross section, preferably substantially circular cross section, of the primary beam that is being focused onto a sample by the objective lens arrangement. To enable effective operation of the stigmator, the primary beam should pass through that location on the optical axis of the stigmator where the stigmator's field is equal to zero. However, since the specific point of the objective lens arrangement for the primary beam passage therethrough is dictated by a predetermined operation of the focusing assembly, it is often the case that a primary beam, after being appropriately aligned by a beam axis alignment system, does not pass through this zero-field location of the stigmator. Consequently, recalibration of the stigmator is needed. The invention "solves" this problem by locating a primary beam axis alignment system downstream of the stigmator with respect to the direction of the primary beam propagation towards a sample.

The present invention is more essential when deflecting of the primary beam by the focusing assembly is needed. Such deflecting may be required to provide a desired incidence of the primary beam onto the sample, namely either normal incidence, at which the primary beam impinges onto the sample along an axis substantially parallel to the optical axis of the objective lens arrangement (perpendicular to the sample's surface, considering a "vertical" column and "horizontal" sample), or oblique incidence, at which the primary beam impinges onto the sample along an axis forming a certain angle with the optical axis of the objective lens arrangement ("tilt mode").

The need for deflecting the primary beam may also be associated with the use of the "in-column detector", i.e., a detector accommodated in the path of the primary beam and formed with an opening, which is located such that the primary beam propagation axis through the column intersects with this opening, which therefore serves as the primary beam hole. In this case, when operating with the high aspect ratio (HAR) mode characterized by a high gradient electric field in the vicinity of the sample, secondary electrons are relatively fast and typically propagate back from the location of interaction between the primary electron beam and the sample's surface along an axis parallel to the optical axis of the objective lens arrangement. If the construction is such that the optical axis of the objective lens arrangement intersects the primary beam hole of the detector, and the primary beam knocks the secondary electrons at the location on the optical axis, most of the secondary electrons would be lost in the primary beam hole. This problem can be solved by appropriately operating deflectors of the focusing assembly to affect the trajectories of the primary and secondary beams to ensure the secondary beam propagation towards the detector region outside the primary beam hole.

In order to enable required deflection of the primary beam axis by the focusing assembly, especially to provide the tilt mode of operation, the beam axis alignment system has to stronger displace the primary beam axis from the initial beam propagation axis, as compared to the operational mode where no such deflection is required. This stronger displacement is achieved by passing higher currents through the coils of the beam axis alignment system. If a stigmator is located downstream of a beam axis alignment system, as in the conventional charged particle beam column, it is more likely that the alignment of the beam axis will result in its displacement from the zero-field point of the stigmator, thereby impeding the effective operation of the stigmator. Moreover, the case may be such that selective application of the tilt mode is desired, namely, the application of the tilt mode to selective locations of the sample, while enabling inspection of these and other locations of the sample with the normal mode. In this case, if a stigmator is accommodated downstream of a beam axis alignment system, adjustment of the stigmator's field would be needed each time when switching to the tilt mode to ensure the primary beam incidence onto the stigmator plane at the zero-field point of the stigmator. The invention "solves" this problem by locating a primary beam axis alignment system downstream of the stigmator.

Preferably, the alignment system is located downstream of the in-column detector. This is also associated with the need for deflecting the primary beam by the focusing assembly: If the alignment system is located upstream of the detector, a displacement of the primary beam axis might result in the beam contact with the walls of the primary beam hole, thereby causing a shading effect. By locating the alignment system downstream of the detector, this problem can be overcome.

There is thus provided according to one aspect of the present invention, a method of directing a primary charged particle beam onto a sample, the method comprising:

(i) directing the primary charged particle beam along an initial beam propagation axis towards a focusing assembly that comprises an objective lens arrangement defining an optical axis;

(ii) passing the primary charged particle beam propagating along the initial axis through a beam shaper to compensate for aberrations produced by the objective lens arrangement;

(iii) aligning the axis of the primary charged particle beam, emerged from the beam shaper and propagating towards the focusing assembly, with respect to the optical axis of the objective lens arrangement.

Preferably, the alignment of the axis of the primary charged particle beam axis is such as to enable further affecting of the trajectory of the primary charged particle beam by at least one deflection field produced by the focusing assembly. This deflection field deflects the primary charged particle beam to provide a desired incidence thereof onto the sample, e.g., either along an axis substantially parallel to the optical axis of the focusing assembly, or along an axis forming a certain angle with the optical axis.

Preferably, the method also includes passing the primary charged particle beam that has passed the beam shaper, through the opening (primary beam hole) of an in-column detector.

Preferably, the primary charged particle beam is passed through the primary beam hole of the detector, prior to aligning the axis of the primary charged particle beam.

According to another aspect of the present invention, there is provided a charged particle beam column for use in inspection of a sample, the column including:

a focusing assembly having an objective lens arrangement defining an optical axis and producing a focusing field to focus a primary charged particle beam onto the sample;

a beam shaper, which is accommodated in the path of the primary charged particle beam that propagates towards the focusing assembly along an initial axis, and which is operable for affecting a cross section of the primary charged particle beam to compensate for aberrations of focusing caused by the objective lens arrangement;

a beam axis alignment system, which is accommodated in the path of the primary charged particle beam, propagating towards the focusing assembly, downstream of the beam shaper, and is operable to align the axis of the primary charged particle beam with respect to the optical axis of the objective lens arrangement.

Preferably, the column also comprises an in-column detector of a secondary charged particle beam produced as a result of the primary beam interaction with the sample, namely the detector formed with an opening and detecting regions outside the opening and accommodated such that the initial axis intersects with this opening, the opening therefore serving as a primary beam hole. The beam axis alignment system may be accommodated downstream of the in-column detector with respect to the direction of the primary beam propagation towards the sample.

It should be understood that the present invention can be used in a charged particle beam column of any kind, namely, a column for directing a primary charged particle beam formed by electrons, positrons, or ions towards a scan area of a sample. More specifically, the present invention is used with an electron beam column (such as used in SEM), and is therefore described below with respect to this application.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

Figure 1:
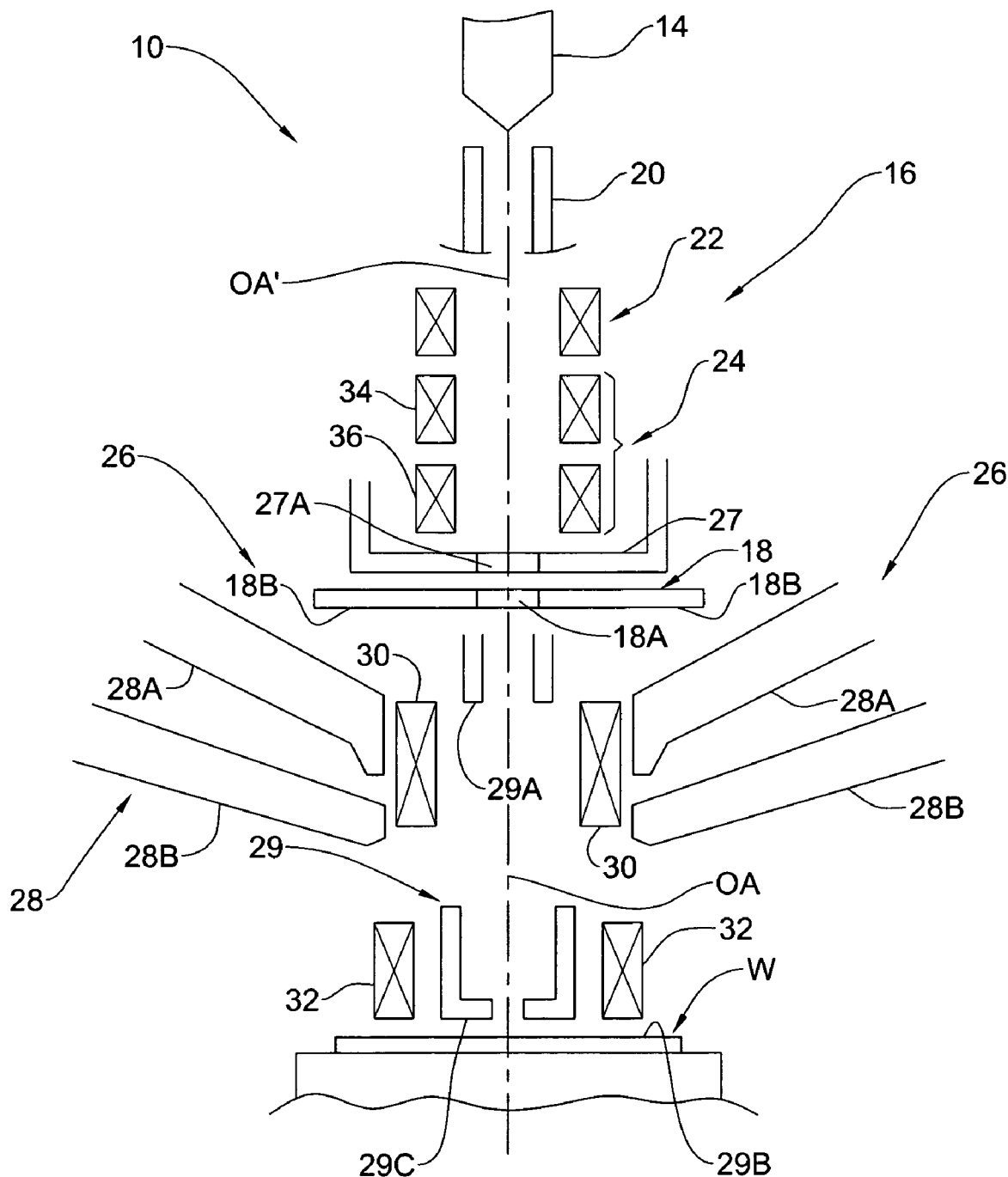
FIG. 1 is a schematic illustration of the main parts of a charged particle beam apparatus according to one example of the present invention.

Referring to FIG. 1, there are illustrated the main components of an SEM system, generally designated 10, associated with a sample (e.g., wafer) W to be inspected. The system 10 comprises an electron beam source 14 (cathode-tip), an electron beam column 16, and a detector 18, which is preferably the so-called "in-column detector" made with a primary beam hole 18a (e.g., of a 1 mm diameter).

The column 16 includes an anode tube 20 defining a primary beam drift space for the primary beam propagation along an initial axis OA' (substantially coinciding with the longitudinal axis of the anode tube); a beam shaper (stigmator) 22; a beam axis alignment system 24 (alignment coils); and a focusing assembly 26. As indicated above, the column 16 also typically comprises a gun alignment system and a beam blank means, which are not specifically shown. Further optionally provided in the SEM 10 is a differential pumping system (DPS) 27 used for maintaining vacuum conditions within upper and lower parts of the vacuum chambers at opposite sides of the DPS. The DPS is usually connected to the sidewall of a vacuum chamber and is formed with an aperture 27a (e.g., of about a 1.3 mm diameter). Generally, the aperture size is such that that it allows the primary beam passage through this aperture and is sufficiently small to minimize leakage from a lower part of the vacuum chamber (with a higher pressure) below the DPS to an upper part of the vacuum chamber above the DPS. The diameter of the aperture 27a may for example be about 1.3 mm.

The focusing assembly 26 has an objective lens arrangement defining an optical axis OA, and a deflector arrangement. In the present example, the objective lens arrangement, in addition to a magnetic objective lens 28 e.g., formed by two polepieces 28a and 28b with a magnetic lens gap therebetween, also includes a retarding electrostatic immersion lens 29. As for the deflector assembly, it is exemplified as being composed of a pair of deflectors 30 and 32. It should be noted, although not specifically shown, that only one deflector can be provided for scanning and/or beam shift purposes, or two deflectors one for scanning and the other for shifting. In this case, the scanning/shifting deflector(s) is typically located adjacent to the lens 28.

The electrostatic lens 29 serves for creating a retarding electric field in the closest vicinity of the wafer to thereby decelerate previously accelerated electrons of the primary beam. A need for a retarding field may be associated with the following. In SEM, in order to reduce the "spot" size of the electron beam up to nanometers, a highly accelerated electron beam is typically produced using accelerating voltages of several tens of kilovolts and more. Specifically, the electron optic elements are more effective (i.e., produce smaller aberrations) when the electrons are accelerated to high kinetic energy. Generally, the landing energy of the primary electron beam is defined by the potential difference between the cathode 14 and the wafer W. To achieve the desired acceleration of electrons, an appropriate potential difference between the cathode 14 and anode 20 should be provided. For example, the cathode voltage $V_c$ can be about (−1) kV and the anode voltage $V_a$ can be about (+8) kV. Hence, the electrons are accelerated on their way towards the magnetic lens 28 having the velocities of 9 keV. However, it has been observed that such a highly energized electron beam causes damage to resist structures and integrated circuits, and, in the case of dialectical samples, causes the undesirable charging of the sample. To avoid these effects, a retarding field is created in the vicinity of the sample.

In the present example, the electrostatic lens 29 is formed by three electrodes: electrode 29a located at the lower end of the anode tube 20, electrode 29b being the wafer's surface, and electrode 29c shaped like a cup being located between electrodes 29a and 29b. To create the retarding filed, the voltage applied to the second electrode 29b (wafer's surface) of the electrostatic lens 29 is typically substantially less than that of the anode tube 20. For example, the case may be such that the wafer is grounded ($V_2=0$), and the electrodes are biased, that is the following voltages may be applied to, respectively, cathode 14, anode tube 20 and cup-electrode 14c: (−1) kV; (+8) kV and (+3) kV. The decelerated primary electron beam impinges onto the wafer's surface within a scan area, and knocks-out secondary electrons. The electric field produced by the electrostatic lens 29, whilst decelerating the electrons of the primary beam, acts as an accelerating field for the secondary electrons, and thereby provides the propagation of the secondary electrons towards the detector.

It should be noted that the provision of a retarding field, as well as any electrostatic lens as an actual physical element, is optional. If deceleration of the primary electrons is required, this effect can be achieved by applying appropriate voltages to the anode tube and sample, or to the anode tube, polepiece of the objective lens and sample. The following are two possible examples of the electric parameters:

(1) the wafer is biased to (−5) kV, the anode voltage is equal to zero and the cathode voltage is (−6) kV;

(2) the wafer is biased to (−3) kV, the pole piece voltage is equal to zero, and the anode and cathode voltage are, respectively, (+5) kV and (−4) kV.

In the present example, the deflectors 30 and 32 are the so-called "in-lens" and "post-lens" deflectors with respect to the deflectors' locations relative to the lens 28. The in-lens deflector 30 is a magnetic deflector and is located within the magnetic lens gap defined by the polepieces of the lens 28, and the post-lens deflector 32 may be either magnetic (as in the present example) or electrostatic. It should be noted that the two deflectors could both be pre-lens deflectors (magnetic or electrostatic), or a pre-lens deflector (magnetic or electrostatic) and an in-lens deflector (magnetic). It should also be noted that the same or additional deflector(s) can be used for scanning purposes.

The deflectors 30 and 32 operate together to provide the desired incidence of the focused primary beam onto the wafer. The first upper deflector 30 tilts the primary beam so as to direct it along an axis forming a certain angle with the optical axis OA of the assembly 26. The second lower detector appropriately deflects the tilted primary beam to direct it onto the sample either along an axis forming a certain angle with the wafer's surface ("tilt mode") or along an axis substantially perpendicular to the wafer's surface ("normal mode"). This will be described more specifically with reference to FIGS. 2A and 2B. It should be understood that the present invention allows for maintaining the wafer in a horizontal plane, and for maintaining the column such that axes OA' and OA are substantially perpendicular to the wafer plane. In other words, the present invention needs tilting of neither the sample nor the column, to provide the desired incidence of the primary beam onto the wafer.

The beam shaper (stigmator) 22 is typically composed of one or more quadruple lenses, and is aimed for compensating aberrations of focusing caused by the astigmatism effect of the objective lens arrangement (e.g., correcting the axial astigmatism). More specifically, the stigmator 22 creates a field of the same axial asymmetry as that of the focusing field of the objective lens arrangement (lenses 28 and 29 in the present example) but with the opposite sign, thereby compensating for the axial asymmetry of the focusing field. In other words, the operation of the stigmator is adjusted to that of the objective lens arrangement to ensure a predetermined cross section of the focused primary beam impinging onto the wafer (preferably, substantially circular cross section of the primary beam). The stigmator is preferably composed of two quadruple lenses oriented at 45 degrees with respect to each other. This and other possible configurations of the stigmator are known per se and therefore need not be specifically illustrated.

The beam axis alignment system 24 is typically composed of at least two alignment coils 34 and 36 arranged in a spaced-apart relationship along the initial axis of the primary beam propagation OA'. In order not to disturb the previously calibrated propagation of the primary beam through that location on the stigmator's axis where a magnetic field produced by the stigmator is equal to zero, the alignment coils 34 and 36 are located downstream of the stigmator 22 with respect to the beam propagation direction towards the focusing assembly 26.

Figure 2B:
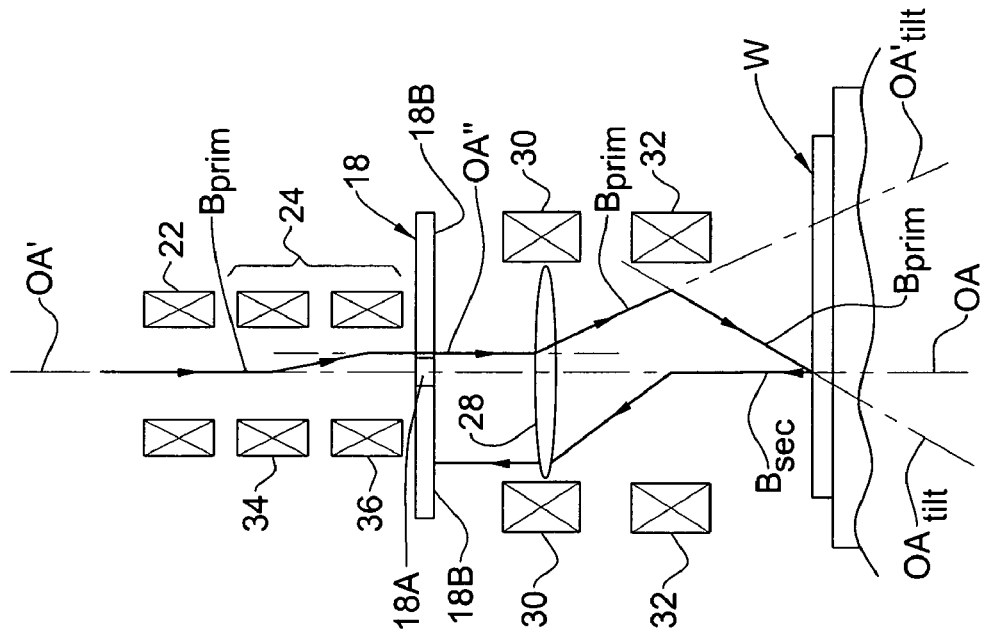
FIGS. 2A and 2B illustrate the beam propagation schemes in the charged particle beam apparatus of FIG. 1 operating with, respectively, normal and tilt modes.
Figure 2A:
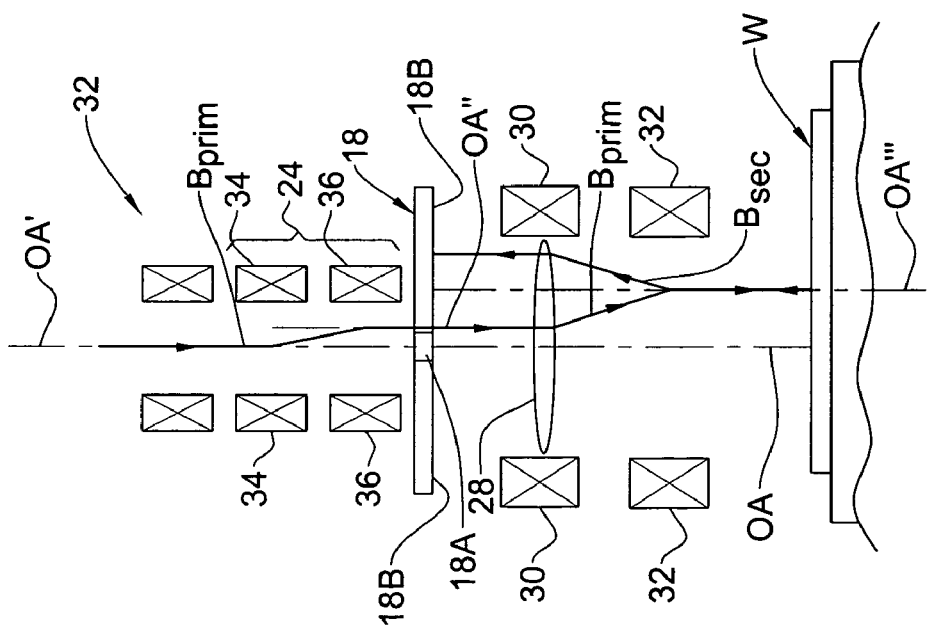

Reference is now made to FIGS. 2A and 2B exemplifying the primary and secondary beam propagation schemes in the column 16 operating at, respectively, normal and tilt modes, as defined above. It should be noted that, the initial axis of the primary beam propagation OA' is preferably parallel to the optical axis OA of the objective lens arrangement. In the present examples, the axes OA' and OA substantially coincide with each other. Additionally, in the present examples, the alignment coils 34 and 36 are located upstream of the in-column detector 18.

A primary beam $B_{prim}$ sequentially passes through the stigmator 22, alignment coils 34 and 36, and focusing assembly 26, and impinges onto the wafer W within a scan area, thereby knocking-out secondary electrons $B_{sec}$ propagating back through the focusing/deflecting assembly towards the detector 18. The stigmator 22 affects the cross section of the primary beam (in accordance with the axial asymmetry of the focusing field of the objective). The alignment coils 34 and 36 sequentially deflect the primary beam to provide its propagation along an axis OA" slightly inclined to the initial axis of beam propagation OA' (at an angle of about 0.1°) OA' to ensure the primary beam passage through the specific (predetermined) point of the objective lens arrangement. This point might not be located on the optical axis of the objective lens arrangement, to facilitate further affecting of the primary beam trajectory by the deflectors 30 and 32 for providing the desired incidence of the beam onto the sample.

FIG. 2A exemplifies the normal incidence of the primary beam $B_{prim}$ onto the wafer along an axis OA''' parallel to and spaced-apart from the initial axis of primary beam propagation OA'. To achieve this, electric currents are appropriately supplied to the first and second deflectors 30 and 32 (e.g., 0.05A and 0.07A, respectively), and different first and second deflecting fields are thereby created. The first deflection field of the deflector 30 effects the tilting of the primary beam $B_{prim}$ to provide its propagation along an axis inclined with respect to the initial axis OA' (e.g., an angle of about 1°). The second deflection field of the deflector 32 deflects the tilted primary beam in a different direction, resulting in the primary beam incidence onto the wafer along the axis OA''' parallel to and spaced from the initial axis of the primary beam propagation OA' a distance of about 50–100 µm.

With regard to the secondary beam propagation, the following should be understood. If no voltage is supplied to the cup-electrode of the electrostatic lens, i.e., $V_{cup}=0V$, the electrostatic lens create a low gradient electric field in the vicinity of the wafer, and thus acts as a short-focus lens for the secondary electrons. The latter therefore cross over the optical axis in the vicinity of the wafer, and becomes directed to regions of the detector at opposite sides of the primary beam hole.

When operating with the HAR mode, which is typically the case (e.g., $V_{cup}$ is about 3 kV), a high-gradient electric field is created in the vicinity of the wafer, and the secondary electrons knocked-out by the primary electrons at the location of their interaction with the wafer's surface, are thus relatively fast and propagate from the location of interaction between the primary beam and the sample's surface along an axis parallel to the optical axis of the objective lens. This is shown in FIGS. 2A and 2B. The secondary beam $B_{sec}$ propagates along the axis OA''' towards the deflector 32, and is sequentially deflected by the second and first deflectors 32 and 30 supplied with the above currents. As a result, the secondary beam $B_{sec}$ is directed towards regions 18b of the detector outside the primary beam hole 18a.

Thus, to enable the required tilting of the primary beam by the first deflector 30, the primary beam should pass through a specific point of the objective lens arrangement spaced-apart from the "central" point thereof. This is achieved by deflecting the primary beam from the initial axis by the beam axis alignment system 24 located downstream of the stigmator. The stigmator 22 may thus be once calibrated with the focusing field produced by the objective lens arrangement to operate together to provide a predetermined (e.g., a substantially circular) cross section of the focused primary beam impinging onto the wafer, and no further adjustment of the stigmator operation is needed.

FIG. 2B exemplifies the SEM operation with the tilt mode. For this purpose, the primary beam is more strongly tilted (at a larger angle, e.g., up to 3–4 degrees) by the first deflector 30 (e.g., by passing an electric current of 0.7A to deflector 30), and then deflected by the second deflector 32 (e.g., supplied with a 0.6A electric current) to provide the primary beam incidence onto the sample along an axis $OA_{tilt}$ inclined with respect to the wafer's surface (e.g., an incident angle of about 15°). In the HAR mode, the secondary beam $B_{sec}$ propagates parallel to the optical axis OA, and is then deflected by the deflectors 32 and 30 to be directed towards the detector region 18b. It should be noted that the tilt mode could be either "on-axis" tilt, i.e., the primary beam incidence onto the wafer along the axis $OA_{tilt}$ intersecting with the optical axis OA on the wafer's surface, or "off-axis" tilt, i.e., the primary beam incidence along an axis $OA'_{tilt}$.

Figure 3:
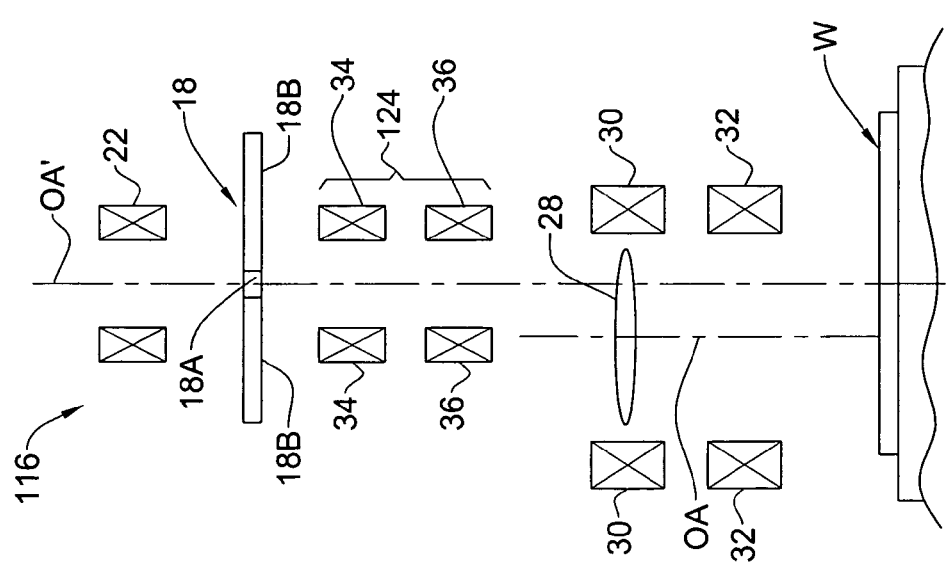
FIG. 3 is a schematic illustration of the main parts of a charged particle beam apparatus according to another example of the present invention.

Reference is made to FIG. 3 illustrating a charged particle beam column 116 according to another example of the invention. To facilitate understanding, the same reference numbers are used to identify components that are common in the columns 16 and 116. In the column 116, in distinction to the column 16, a beam axis alignment system 124 is located downstream of the detector 18. Such a design might be preferred when larger-angle tilting of the primary beam by the first deflector 30 is needed. Additionally, in the present example, the initial axis of the primary beam propagation OA' is parallel to and spaced apart from the optical axis OA of the objective lens 28. It should be understood that such a shifting of the initial axis of primary beam propagation with respect to the optical axis of the objective lens is aimed at providing secondary beam propagation to the regions 18b of the detector 18 outside the primary beam hole, and could also be employed in the column 16 described above. In other words, the shift between the axes OA' and OA is irrespective of the location of the beam axis alignment system (24 in FIG. 1 or 124 in FIG. 3) relative to the detector 18.

Figure 4B:
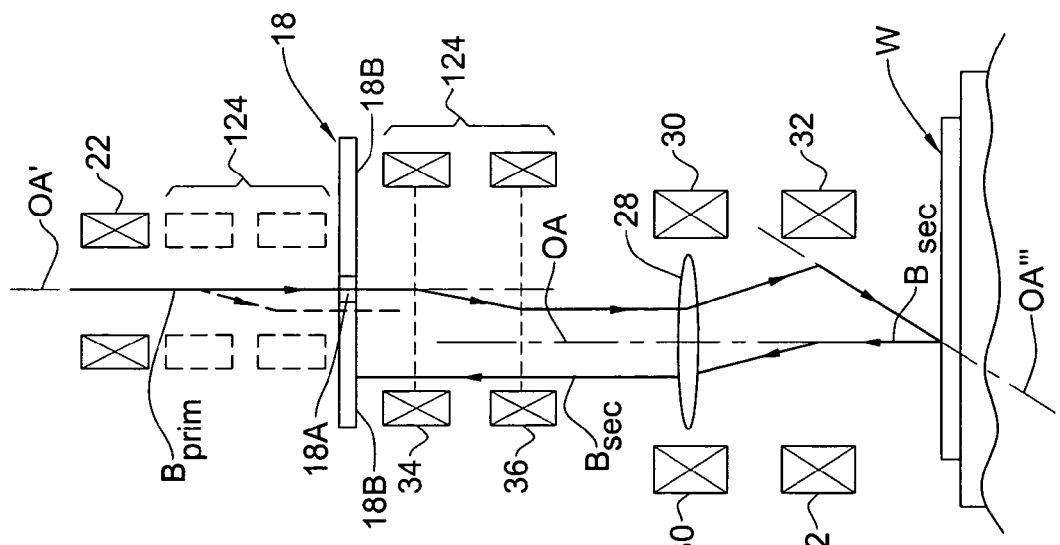
FIGS. 4A and 4B illustrate the beam propagation schemes in the charged particle beam apparatus of FIG. 3 operating with, respectively, normal and tilt modes.
Figure 4A:
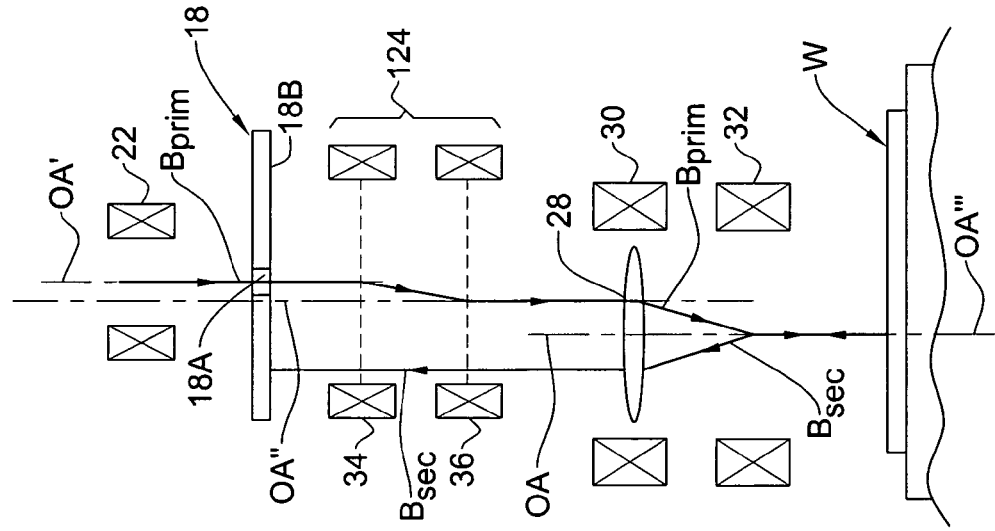

FIGS. 4A and 4B illustrate the primary and secondary beam propagation schemes in the column 116 for the normal and tilt modes, respectively. The primary beam $B_{prim}$ passes the stigmator 22, which appropriately affects the beam cross section, and then passes through the primary beam hole 18a of the detector 18. Having passed through the primary beam hole 18a, the beam $B_{prim}$ passes through the coils 34 and 36 of the beam axis alignment system 124, and enters the focusing assembly 26 along an axis OA" slightly inclined to the initial axis OA' (e.g., an angle of about 0.1–0.2 degrees). The deflectors 30 and 32 operate as described above to provide the primary beam incidence onto the wafer W substantially along the optical axis OA of the objective lens 28 (FIG. 4A), or along an axis OA''' inclined with respect to the optical axis OA (FIG. 4B). For the reasons described above, the secondary electron beam $B_{sec}$ propagate back in a direction parallel to the optical axis OA, and its trajectory is then affected by the deflection fields of the deflectors 30 and 32. As a result, the secondary electron beam $B_{sec}$ is directed to the regions 18b of the detector outside the primary beam hole 18a.

As shown in dashed lines in FIG. 4B, if the alignment coils 34 and 36 are located above the detector 18, the situation (i.e., the deflection condition) might be such that the primary beam appropriately aligned by the coils 34 and 36 contacts the walls of the primary beam hole 18a. This is avoided by locating the beam axis alignment system 124 downstream of the detector 18. By locating the beam axis alignment system downstream of the in-column detector, a smaller primary beam hole, as well as smaller DPS aperture can be used.

Those skilled in the art will readily appreciate that various modifications and changes can be applied to the embodiments of the invention as hereinbefore exemplified without departing from its scope defined in and by the appended claims.

The invention claimed is:

1. A method of directing a primary charged particle beam onto a sample, the method comprising:
   (i) directing the primary charged particle beam along an initial beam propagation axis towards a focusing assembly that comprises an objective lens arrangement defining an optical axis;
   (ii) passing the primary charged particle beam propagating along the initial axis through a beam shaper to compensate for aberrations of focusing produced by the objective lens arrangement;
   (iii) thereafter, passing the primary charged particle beam through an opening of a detector having detecting regions outside said opening, the detector accommodated such that said initial axis intersects with said opening and being capable of detecting a secondary charged particle beam resulting from an interaction of the primary charged particle beam with the sample;
   (iv) aligning the axis of the primary charged particle beam, with respect to the optical axis of the objective lens arrangement by applying at least two deflecting fields to the primary charged particle beam, said at least two deflecting fields being arranged along the optical axis of the objective lens arrangement and disposed between the detector and the objective lens arrangement.

2. The method according to claim 1, wherein the initial axis is parallel to the optical axis of the objective lens arrangement.

3. The method according to claim 2, wherein said initial axis is spaced-apart from said optical axis of the objective lens arrangement.

4. The method according to claim 1 further comprising affecting the trajectory of the primary charged particle beam while propagating through the focusing assembly.

5. The method according to claim 4, wherein said affecting comprises sequentially deflecting the primary charged particle beam by at least two deflection fields at two spaced-apart locations along the optical axis of the objective lens arrangement.

6. The method according to claim 4, wherein said affecting comprises deflecting the primary beam with respect to the optical axis of the objective lens arrangement to thereby provide desired incidence of the primary charged particle beam onto the sample.

7. The method according to claim 6, wherein the primary beam is incident onto the sample along an axis substantially parallel to the optical axis of the objective lens arrangement.

8. The method according to claim 6, wherein the primary beam is incident onto the sample along an axis forming a certain angle with the optical axis of the objective lens arrangement.

9. A method of directing a primary charged particle beam onto a sample, the method comprising:
   directing the primary charged particle beam along an initial beam propagation axis towards a focusing assembly, that comprises an objective lens arrangement defining an optical axis, and a deflector arrangement;

passing the primary charged particle beam propagating along the initial axis through a beam shaper to compensate for aberrations of focusing caused by astigmatism effect of a focusing field produced by the objective lens arrangement;

thereafter passing the primary charged particle beam through an opening of a detector having detecting regions outside said opening and being accommodated such that said initial axis intersects with said opening, the detector being capable of detecting a secondary charged particle beam resulting from an interaction of the primary charged particle beam with the sample;

aligning the axis of the primary charged particle beam, passed through the beam shaper and propagating towards the focusing assembly, with respect to the optical axis of the objective lens arrangement after passage of the primary charged particle beam through said opening of the detector; and affecting the trajectory of the primary charged particle beam by said focusing assembly.

10. The method according to claim 9, wherein said affecting of the trajectory of the primary charged particle beam comprises deflecting the primary charged particle beam by at least two deflection fields in a spaced-apart locations along the optical axis of the objective lens arrangement.

11. The method according to claim 10, wherein the deflected primary charged particle beam is directed to the sample along an axis substantially parallel to the optical axis of the objective lens arrangement.

12. The method according to claim 10, wherein the deflected primary charged particle beam is directed to the sample along an axis forming an angle with the optical axis of the objective lens arrangement.

13. The method according to claim 10, wherein said initial axis is parallel to the optical axis of the objective lens arrangement.

14. The method according to claim 13, wherein said initial axis is spaced-apart from said optical axis of the objective lens arrangement.

15. A method of directing a primary charged particle beam onto a sample to thereby produce a beam of secondary particles returned from the sample as a result of an interaction between the sample and the primary charged particle beam, the method comprising:

directing the primary charged particle beam along an initial axis towards a focusing assembly that comprises an objective lens arrangement defining an optical axis, and a deflector arrangement;

passing the primary charged particle beam, propagating along the initial axis towards the focusing assembly, through a beam shaper to compensate for aberrations of focusing caused by astigmatism effect of a focusing field produced by the objective lens arrangement;

passing the primary charged particle beam, passed through the beam shaper, through an opening of a secondary charged particles detector, which has detecting regions outside said opening, the detector being accommodated such that said initial axis intersects with said opening;

aligning the axis of the primary charged particle beam, passed through the opening of the secondary charged particles detector and propagating towards the focusing assembly, with respect to the optical axis of the objective lens arrangement;

affecting the trajectory of the primary charged particle beam while propagating through said focusing assembly to provide desired incidence of the focused primary charged particle beam onto the sample; and affecting the trajectory of the secondary charged particle beam while propagating through said focusing assembly to provide the secondary charged particle beam propagation to said detecting regions of the detector outside said opening.

16. The method according to claim 15, wherein said initial axis is substantially parallel to the optical axis of the objective lens arrangement.

17. The method according to claim 16, wherein said initial axis is spaced-apart from said optical axis of the objective lens arrangement.

18. The method according to claim 17, wherein said affecting of the trajectory of the primary charged particle beam comprises deflecting the primary charged particle beam by at least two deflection fields in a spaced-apart locations along the optical axis of the objective lens arrangement and disposed between the detector and the objective lens arrangement.

19. The method according to claim 18, wherein the deflected primary charged particle beam is directed to the sample along an axis substantially parallel to the optical axis of the objective lens arrangement.

20. The method according to claim 18, wherein the deflected primary charged particle beam is directed to the sample along an axis forming an angle with the optical axis of the objective lens arrangement.

21. A charged particle beam column for use in inspection of a sample, the column including:

a focusing assembly having an objective lens arrangement defining an optical axis and producing a focusing field to focus a primary charged particle beam onto the sample;

a beam shaper, which is accommodated in the path of the primary charged particle beam that propagates towards the focusing assembly along an initial axis, and which is operable for affecting a cross section of the primary charged particle beam to compensate for aberrations of focusing caused by astigmatism effect of the focusing field produced by the objective lens arrangement;

a detector, having an opening and charged particle detecting regions outside said opening, the dector being accommodated in the path of the primary charged particle beam, passed through the beam shaper, such that the initial axis intersects with said opening;

a beam axis alignment system, which is accommodated in the path of the primary charged particle beam, propagating towards the focusing assembly, downstream of the beam shaper, and is operable to align the axis of the primary charged particle beam with respect to the optical axis of the objective lens arrangement wherein said beam axis alignment system comprises at least two coils arranged in a spaced-apart relationship along said initial axis, each operable to create a deflection field and disposed between the detector and the objective lens arrangement.

22. The column according to claim 21, wherein said detector is accommodated upstream of said beam axis alignment system with respect to the direction of propagation of the primary charged particle beam towards the sample.

23. The column according to claim 21, wherein said initial axis is substantially parallel to the optical axis of the objective lens arrangement.

24. The column according to claim 23, wherein said initial axis is spaced-apart from said optical axis of the objective lens arrangement.

25. The column according to claim 21, wherein the focusing assembly is operable to affect the trajectory of the primary charged particle beam to provide desired incidence of the focused primary charged particle beam onto the sample, and is operable to affect the trajectory of a beam of secondary charged particles produced by interaction of the primary charged particle beam with the sample.

26. The column according to claim 21, wherein the focusing assembly comprises a deflector arrangement.

27. The column according to claim 26, wherein said deflector assembly comprises at least two deflectors, which are arranged in a spaced-apart relationship along the optical axis of the objective lens arrangement.

28. A system for inspecting a sample by directing a primary charged particle beam onto the sample to produce a secondary charged particle beam as a result of the interaction between the primary charged particle beam and the sample, the system comprising a source generating charged particles forming the primary charged particle beam, a charged particle beam column defining a space for the primary charged particle beam propagation towards the sample, and a detection unit for detecting the secondary charged particle beam, said charged particle beam column comprising:
 a focusing assembly having an objective lens arrangement defining an optical axis and operable to focus a primary charged particle beam onto the sample;
 a beam shaper, which is accommodated in the path of the primary charged particle beam, that propagates towards the focusing assembly along an initial axis of beam propagation, and which is operable for affecting a cross section of the primary charged particle beam to compensate for aberrations of focusing caused by astigmatism effect of a focusing field produced by the objective lens arrangement; and
 a detector having an opening and charged particle detecting regions outside said opening, and being accommodated in the path of the primary charged particle beam, passed through the beam shaper, such that the initial axis intersects with said opening;
 a beam axis alignment system, which is accommodated in the path of the primary charged particle beam propagating towards the focusing assembly, downstream of the beam shaper, and is operable to align the axis of the primary charged particle beam with respect to the optical axis of the objective lens arrangement wherein said beam axis alignment system comprises at least two coils arranged in a spaced-apart relationship along said initial axis, each operable to create a deflection field and disposed between the detector and the objective lens arrangement.

29. The system according to claim 28, wherein said detector is accommodated downstream of the beam axis alignment system with respect to the direction of the primary charged particle beam propagation towards the sample.

30. The system according to claim 28, wherein the optical axis of the objective lens arrangement is substantially parallel to the initial axis.

31. The system according to claim 30, wherein the optical axis of the objective lens arrangement is spaced-apart from the initial axis.

32. The system according to claim 28, wherein said beam axis alignment system comprises at least two coils arranged in a spaced-apart relationship along said initial axis, each coil being operable to create a deflection field.

33. The system according to claim 28, wherein said focusing assembly comprises a deflector arrangement.

34. The system according to claim 33, wherein said deflector assembly comprises at least two deflectors accommodated in a spaced-apart relationship along the optical axis, each deflector being operable to create a deflection in the paths of the primary and secondary charged particle beams.

* * * * *